US012719012B2

(12) United States Patent
Valík et al.

(10) Patent No.: US 12,719,012 B2
(45) Date of Patent: Aug. 25, 2026

(54) METHOD OF SAMPLE PREPARATION AND ANALYSIS

(71) Applicant: FEI Company, Hillsboro, OR (US)

(72) Inventors: Michal Valík, Neslovice (CZ); Petr Malek, Domasov (CZ); John Mitchels, Klobouky u Brna (CZ); František Vaške, Brno (CZ); Veronika Vrbovská, Brno (CZ); Miloš Hovorka, Brno (CZ)

(73) Assignee: FEI COMPANY, Hillsboro, OR (US)

( * ) Notice: Subject to any disclaimer, the term of this patent is extended or adjusted under 35 U.S.C. 154(b) by 309 days.

(21) Appl. No.: 18/360,232

(22) Filed: Jul. 27, 2023

(65) Prior Publication Data

US 2024/0162001 A1 May 16, 2024

(30) Foreign Application Priority Data

Jul. 27, 2022 (EP) .................................... 22187316

(51) Int. Cl.
*H01J 37/20* (2006.01)
*H01J 37/28* (2006.01)

(52) U.S. Cl.
CPC ............. *H01J 37/20* (2013.01); *H01J 37/28* (2013.01); *H01J 2237/20207* (2013.01); *H01J 2237/208* (2013.01); *H01J 2237/2802* (2013.01); *H01J 2237/31749* (2013.01)

(58) Field of Classification Search
CPC .. H01J 37/00; H01J 37/02; H01J 37/20; H01J 37/26; H01J 37/28; H01J 2237/20207; H01J 2237/208; H01J 2237/28; H01J 2237/31749; H01J 2237/20292; H01J 2237/31745
USPC ................................ 250/306, 307, 310, 311
See application file for complete search history.

(56) References Cited

U.S. PATENT DOCUMENTS

| | | | | |
|---|---|---|---|---|
| 6,002,136 A * | 12/1999 | Naeem | H01J 37/20 378/45 |
| 7,989,778 B2 | 8/2011 | Oetelaar et al. | |
| 2012/0128028 A1 * | 5/2012 | van den Boom | H01J 37/26 374/159 |
| 2021/0407761 A1 * | 12/2021 | Maeda | H01J 37/22 |

FOREIGN PATENT DOCUMENTS

| | | |
|---|---|---|
| WO | 2005098895 A2 | 10/2005 |

* cited by examiner

*Primary Examiner* — Jason L Mccormack
(74) *Attorney, Agent, or Firm* — Michael Best & Friedrich LLP

(57) ABSTRACT

The present invention provides a method of sample preparation and analysis and a sample holder that may be used in said method.

10 Claims, 5 Drawing Sheets pool ("tube")

groove

METHOD OF SAMPLE PREPARATION AND ANALYSIS

CROSS REFERENCE TO RELATED APPLICATIONS

This application claims priority to European Application No. EP22187316.9, filed Jul. 27, 2022, the entire contents of which is herein incorporated by reference.

The present invention provides a method of sample preparation and analysis and a sample holder that may be used in said method.

BACKGROUND OF THE INVENTION

In a charged particle microscope, such as a transmission electron microscope (TEM), a parallel, high-energy beam of electrons with an energy of, for example, 300 keV is shot at the sample. As a result of interaction between the electrons and the sample, electrons in the beam will, for example, be deflected, loose energy or be absorbed, which can yield information about the sample. By arranging the electron beam to impinge in the correct manner upon, for example, a fluorescent screen and/or a CCD camera, the information can be rendered visible.

The sample can also be irradiated by a focused beam-scanning electron microscopy, in which the beam is moved across the sample in a raster. This mode of operation is also possible in the TEM, the so-called Scanning Transmission Electron Microscopy mode (STEM mode). Position-dependent information in the form of secondary particles, such as secondary electrons and X-rays, is produced.

For use in a charged particle microscope, such as a TEM, samples need to be very thin, for example less than 300 nm, preferably less than 150 nm. Presently, sample thicknesses of as low as approximately 50 nm can be used. To give a low sample thickness the sample is thinned before it is studied in a charged particle microscope. As known to those skilled in the art, use is made of a focused ion beam for ion milling the sample down to the desired thickness, after which the sample can be transferred to the charged particle microscope. Thinning and transferring may comprise an in-situ (on the original carrier) or ex-situ lift out technique (transfer from one place to the carrier), as is known to those skilled in the art.

For better handling and transport of such a fragile object, for example before and after thinning, the sample is usually mounted on a so-called grid or Autogrid (rigid supporting carrier). An ex-situ lift out technique may use a so-called half-moon grid, where a chunk of material is attached to a protruding element of said half-moon grid which is clipped inside the Autogrid, and then thinned to the desired thickness using, for example a Focused Ion Beam (FIB).

Charged particle microscope samples with a thickness of, for example, less than 300 nm are of themselves too fragile to be manipulated directly with a cartridge or stage holder and are usually mounted on a thin round foil with a diameter of 3.05 mm and a thickness of, for example, less than 20 μm. The central portion of such a foil is embodied as a gauze, whereby the electrons can move through the sample and through the holes in the gauze without being absorbed by the material of the foil. This foil—the so-called grid—is subsequently mounted in a hollow of a sample holder, which sample holder in turn is attached to a cartridge or stage holder of the charged particle microscope. Such grids, made from various materials and with various sizes of the meshes of the gauze and a thickness of, for example, about 15 μm, are commercially available.

For in-situ measurements a grid containing the sample may be fixed inside the Autogrid and then thinned. The carrier may also have a direct immobilisation of the sample on to the Autogrid. Once the sample has the desired thickness, the combination of sample, grid and/or Autogrid (or any other combination including the sample) is transferred to the charged particle miscoscope, and the sample can be studied.

For example, in a method that is often used, the sample is first mounted on a grid, after which the sample holder is introduced into an apparatus that comprises both a column of a Scanning Electron Microscope (SEM) and a column of a Focused Ion Beam (FIB). Such apparatus are commercially available, e.g. the DualBeam™ apparatus of the firm FEI Company in Hillsboro, USA.

In such a DualBeam™ apparatus, the sample is first localized on the grid with the aid of the SEM column, after which it is subsequently thinned to the desired thickness using the FIB column, while the progress of the thinning operation is monitored with the aid of the SEM column. Imaging may also take place in the FIB-SEM or Light Microscope.

So as to be able to properly study a sample, it is not only necessary to position the electron beam with respect to the sample, but it is often also necessary to be able to inspect the sample at an angle. To this end, not only does the cartridge or stage holder move the sample holder—and, thereby, also the sample—in an x-y plane perpendicular to the electron beam, but it can also turn, for example, about the longitudinal axis of the sample holder, in the x-y plane (the so-called $\alpha$-tilt). Moreover, one ensures in this manner that the middle of the sample stays at the same position, the so-called Eucentric position.

However, moving samples in and out of the microscopes (such as between the DualBeam™ and TEM) suffers from alignment issues. This is due to variation in the position of the grid/Autogrid within the microscopes. For example, Conventional grids/Autogrids are prone to rotation misalignments when transferred to a TEM due to their round-shape geometry and manual handling steps. Therefore, undesired gamma tilt can occur.

These manual handling steps are typically carried out with tweezers while for example unloading Autogrids from grid boxes or the FIB-shuttle and loading them into the TEM cassette. This can result in Autogrids being loaded into the TEM cassette with their lamella milling axes not correctly aligned with respect to the TEM tilt-axis (see FIG. 2).

As a consequence, the accessible area for tomography on the sample (i.e. the lamella) becomes reduced and, more severe, during tomography data acquisition, the side walls (next to the lamella) can obscure the image acquisition process (edges will shadow/move into the field of view at higher tilt angles). Undesired tilt causes at least one of defocus between alignment patch and acquisition patch, loss of resolution during tomography acquisition and an increase blockage of the lamella at higher tilts. This misalignment is also an issue for automation which needs to be complex to recognise and compensate for these positioning artefacts.

The listing or discussion of an apparently prior-published document in this specification should not necessarily be taken as an acknowledgement that the document is part of the state of the art or is common general knowledge.

It would therefore be advantageous to provide method of sample preparation and analysis where the orientation used during sample preparation, i.e. the orientation of the sample during FIB milling is maintained/is the same as the orientation used during analysis of the sample.

Additionally, it is also desirable to ensure that the sample is placed in the correct location for preparation, i.e. electron transparent sample preparation, and that the sample is unobscured during preparation and/or analysis. For example, where the sample material is attached to a protruding element of said grid.

DESCRIPTION OF THE INVENTION

Thus, the present invention provides a method of sample preparation and analysis, wherein the method comprises the steps of:

(i) Providing a sample holder having a sample provided thereon, wherein said sample holder defines a Z-axis perpendicular to the sample holder plane and a gamma rotation (y) around the Z-axis;

(ii) Using a focused ion beam to remove at least part of the sample to provide a milled sample;

(iii) Transferring the sample holder with the milled sample obtained in step (ii) to a charged particle microscope;

(iv) Irradiating a region of interest on the milled sample with a charged particle beam of said charged particle microscope, characterised in that the method further comprises the step of providing means on the sample holder for maintaining the gamma rotation of the sample holder in step (ii), for example when positioned in a cartridge or stage holder in the charged particle microscope.

This method is hereinafter referred to as "the method" or "the method of the invention".

To aid clarity, a Cartesian coordinate system will be adhered to in this application, in which where X, Y and Z are translation axes and alpha, beta and gamma are respective rotations.

In step (i) a sample is provided on the sample holder. The sample holder defines a Z-axis perpendicular to the sample holder plane. The gamma axis rotates around the Z-axis.

The sample holder plane may typically be situated in the XY plane. For example, the main body of the sample holder extends in the XY plane.

The coordinates applied in the application can be seen in FIG. 3.

In step (ii), a focused ion beam is used to remove at least part of the sample to provide a milled sample. The alignment of the milled sample will depend on orientation of the sample holder relative to the focused ion beam. The focused ion beam orientation may typically be in the YZ plane.

The milled sample may therefore have a milling axis (or a lamella milling axis). The milling axis may define a Y-axis.

Step (ii) may be conducted in any suitable FIB workstation.

Typically, in step (ii) removing at least part of the sample provides a transparent sample, i.e. a transparent sample surface.

The milled sample may be a milled sample surface or a sample surface, i.e. a milled transparent sample surface.

In step (iii) the sample holder (and therefore milled sample) is transferred to charged particle microscope. The transfer of the sample holder to a charged particle microscope may be performed by any means suitable for conducting the transfer. For example, the sample may be unloaded from an Autoloader equipped system and directly loaded to another via the same system, or the sample may be demounted from the microscope cassette/shuttle and placed into storage, where the sample holder provides means to enable the gamma axis to be correctly aligned if reloaded. In a particular embodiment, the transfer may be performed automatically using an automated loader, such as the loader described in U.S. Pat. No. 7,989,778B2.

In should be noted that step (iii) may be performed once or may be performed multiple times, i.e. between more than one charged particle microscope.

In step (iv) a region of interest on the milled sample is irradiated and/or scanned by a charged particle beam of a charged particle microscope.

The charged particle microscope may be a TEM, SEM, FIB-SEM or a STEM.

The correct alignment of the milled sample with the charged particle beam is provided by means on the sample holder that maintain the gamma rotation of the sample holder in step (ii).

The gamma rotation may typically be maintained when the sample holder is placed in a cartridge or stage holder within the charged particle microscope. As used herein, a "cartridge" or "stage holder" is a device that can be used to position the sample on the sample holder within the charged particle microscope. Such cartridges or stage holders are known in the art and may also be referred to as "stages" or "stage assemblies", as described in EP1735811.

Maintaining the gamma rotation may mean preventing a change in the gamma rotation of the sample holder. For example, the gamma rotation in step (iv) may be the same (substantially the same) as the gamma rotation in step (ii).

The longitudinal axis of the cartridge or stage holder may define an X-axis (tilt axis). The X-axis may be ±90 degrees relative to the y-axis (the milling axis).

Thus, maintaining the gamma rotation may maintain the angle between the X-axis and the Y-axis at ±90 as shown in FIG. 2.

Typically, the X-axis (tilt axis) intersects the Y-axis of the milled sample. For example, the X-axis may intersect the Y-axis in the centre of the sample holder.

In the method of the invention, the Z-axis may typically be colinear with the charged particle beam.

The sample holder may be centrally aligned about the tilt axis (-axis).

The X-axis (tilt axis) of the charged particle microscope typically defines an axis (an alpha axis).

Due to the relationship between the gamma axis and the position of the sample and/or sample holder within the charged particle microscope, i.e. within the cartridge or stage holder ensuring that the alignment of the gamma axis is substantially the same in step (iv) as step (ii) assures that the milled sample provided in step (ii) is aligned correctly with the tilt axis of the charged particle microscope.

In the method of the invention, the means for setting the orientation of the sample holder in step (ii) may be established through at least one orientation element situated on the sample holder.

The at least one orientation element may fix the orientation of the sample axis when the holder is placed within a cassette or stage holder in step (ii) and/or (iv).

Thus, the present invention also provides a sample holder for carrying a sample to be irradiated with an electron beam, which sample holder comprises a sample receiving area (1) and an outer edge (2), characterised in that the outer edge (2) of the holder comprises at least one orientation element, wherein the at least one orientation element is configured to be received by a cassette or stage holder.

The at least one orientation element may fix the orientation in the cassette or stage holder due to the orientation element fitting to a respective portion of a cassette or stage holder.

For example, the at least one orientation element may engage the respective portion of the cassette or stage holder with a complementary fit.

The respective portion of the cassette or stage holder may comprise a recess to fit the at least one orientation element.

The sample holder may comprise two orientation elements on opposing sides of the sample holder. For example, the two orientation elements may be situated parallel to each other.

The orientation elements may be the same length as each other or may be different. In a preferred aspect, the orientation elements are the same length.

The sample receiving are may be any suitable shape. However, it may be preferred that the sample receiving area is substantially circular.

The sample receiving area may be located centrally in the sample holder and may be at least partially transparent to electrons with the outer edge located at the periphery of the sample receiving area.

In an aspect of the sample holder of the invention, at least a portion of the outer edge (2) of the holder may be curved and said orientation elements may be in the form of straight edges adjoining the curved portion of the outer edge.

In the sample holder of the invention, in at least a portion of the periphery of the sample receiving area, the outer edge (2) may have a thickness that is greater than the thickness of the sample receiving area (1). For example, at least half or all of the periphery of the sample receiving area may have a thickness that is greater than the thickness of the sample receiving area (1).

The outer edge (2) may be formed in such a manner that an electron beam passing through the sample receiving area (1), with an angle of incidence of the electron beam of +/−70 degrees with respect to the normal to the sample receiving area (1), will not be hindered by the outer edge (2).

The outer edge (2) may have a thickness that is at least twice as large as the thickness of the sample receiving area (1).

In an alternative aspect of the sample holder of the invention as described above, the sample receiving area may be a protrusion situated on the outer edge of the sample holder.

In an aspect of the sample holder of the invention, where the sample receiving area comprises a protrusion, the outer edge may comprise at least three substantially straight edges, wherein at least one of the sides comprises the at least one orientation element.

For example, the sample holder may comprise two orientation elements situated parallel to each other, where the protrusion is situated on a substantially straight edge between the two elements.

The outer edge comprising the protrusion may slope away from the protrusion. For example, the outer edge either side of the protrusion may have a slope angle of from about 1 to about 10 degrees, such as from about 3 to about 7 degrees, or from about 5 to about 6 degrees from the protrusion to the orientation element.

The protrusion may be centrally located between the two orientation elements.

The fourth edge of the sample holder (i.e. the edge opposed the edge comprising the protrusion) may be curved.

The protrusion may be in the form of a nanotextured or chemically modified area on the protrusion groove, a pool, a comb and/or a tube.

The protrusion may extend less than 1 mm from the sample holder.

The sample holder may further comprise a raised body located centrally on the outer edge opposed to the protrusion. The raised body may be used to load and unload the sample holder from a cassette or stage holder.

The sample holder as defined above may be used in a method of the invention as defined herein.

For the avoidance of doubt, in this specification when we use the term "comprising" or "comprises" we mean that the feature being described must contain the listed component(s) but may optionally contain additional components. When we use the term "consisting essentially of" or "consists essentially of" we mean that the feature being described must contain the listed component(s) and may also contain other components provided that any components do not affect the essential properties of the feature. When we use the term "consisting of" or "consists of" we mean that the feature being described must contain the listed component(s) only.

It would be clear to the person skilled in the art that the features and combinations defined with respect to the charged particle microscope, apply equally to the method and combination defined above.

The drawings, which are not necessarily to scale, depict selected embodiments and are not intended to limit the scope of the invention. The detailed description illustrates, by way of example, not by way of limitation, the principles of the invention. The description will clearly enable one skilled in the art to make and use the invention, and described several embodiments, adaptions, variations, alternatives and uses of the invention. As used herein, the terms "about" or "approximately" for any numerical values or ranges indicate a suitable dimensional tolerance that allows the part or collection of components to functions for its intended purpose as described.

The invention will be described in more detail below on the basis of the figures.

DETAILED DESCRIPTION OF THE INVENTION

Figure 1:
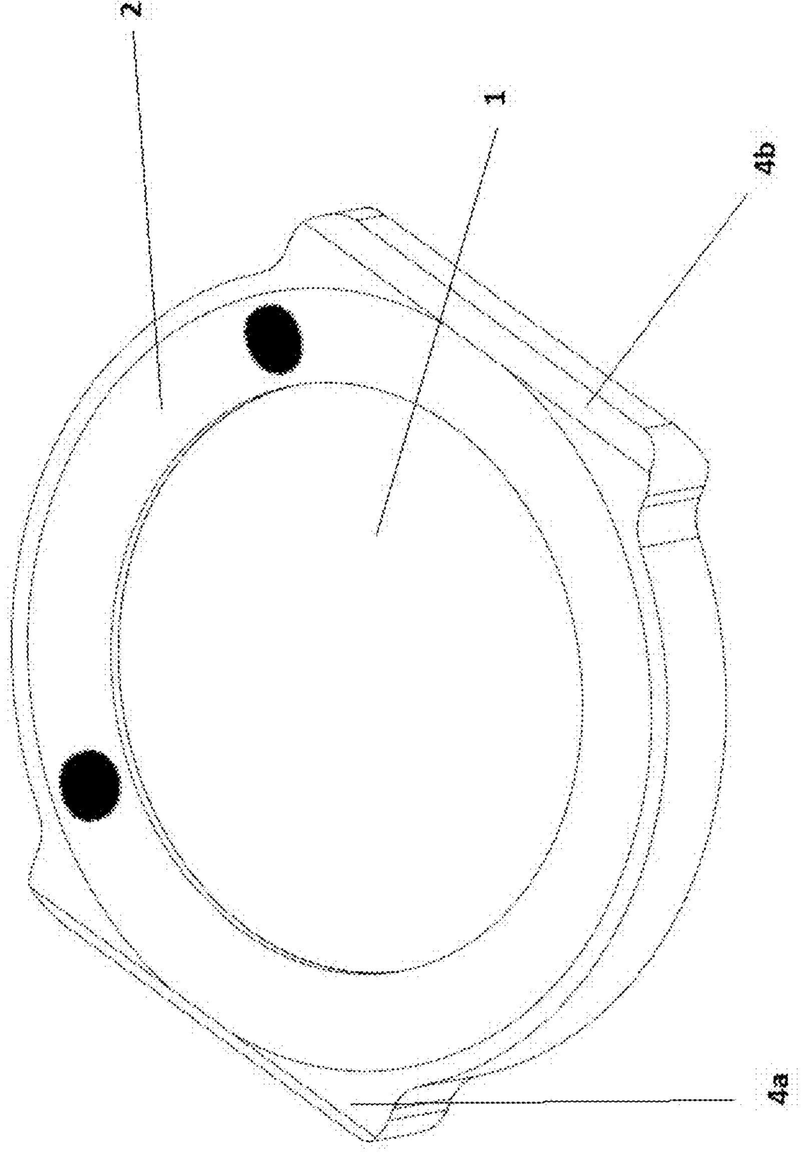
FIG. 1 shows an embodiment of a sample holder of the invention where the sample receiving area is centrally located.

FIG. 1 shows an embodiment of a sample holder of the invention. As shown, the sample holder comprises a sample receiving area (1) and an outer edge (2).

Figure 3:
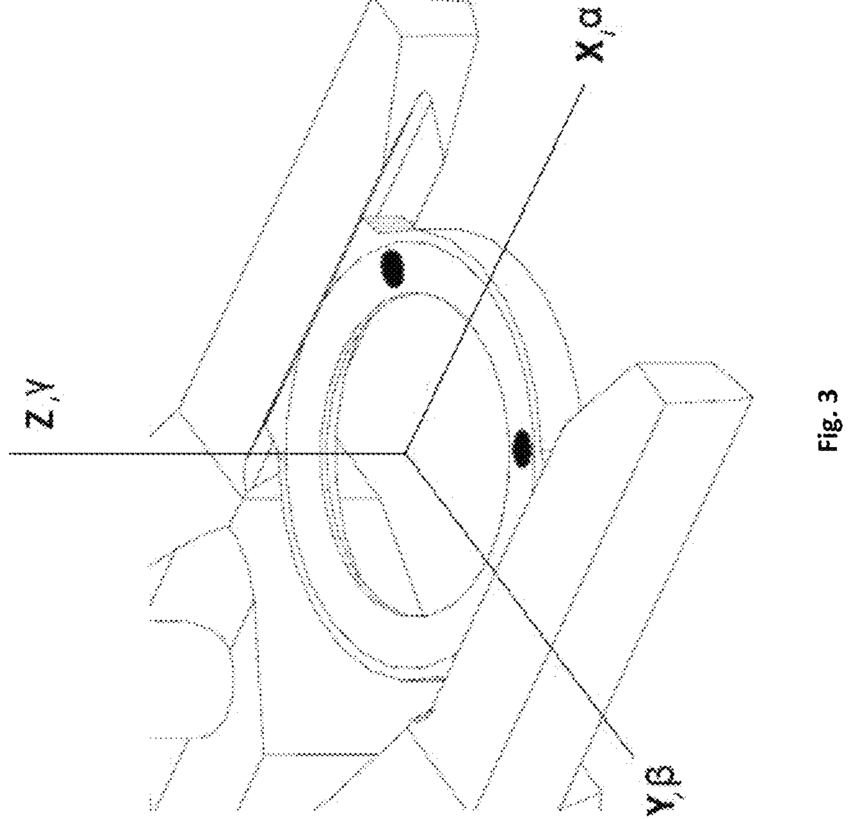
FIG. 3 illustrates the relevant axes relative to the sample holder and cassette/stage holder in a charged particle microscope, where X, Y and Z are translation axes and alpha, beta and gamma are respective rotations.

The sample holder, as shown, comprises two orientation elements (4*a* and 4*b*) in the form of straight edge on opposing sides of the sample holder. The two orientation elements are parallel to each other and substantially the sample size. As shown in FIG. 3, the sample holder defines a sample holder plane that extends in the XY plane. The Z-axis extends substantially perpendicular to the sample holder plane, or vertical to the sample holder plane. Gamma rotation occurs around the Z-axis.

The outer edge between the two orientation elements are is curved. In the sample holder shown, the outer edge between the two orientation elements follows the same shape as the sample receiving area (1).

The sample receiving area (1) is located centrally in the sample holder and is transparent to electrons. The outer edge (2) is located at the periphery of the sample receiving area (1).

The sample receiving area (1) is substantially circular.

Figure 2:
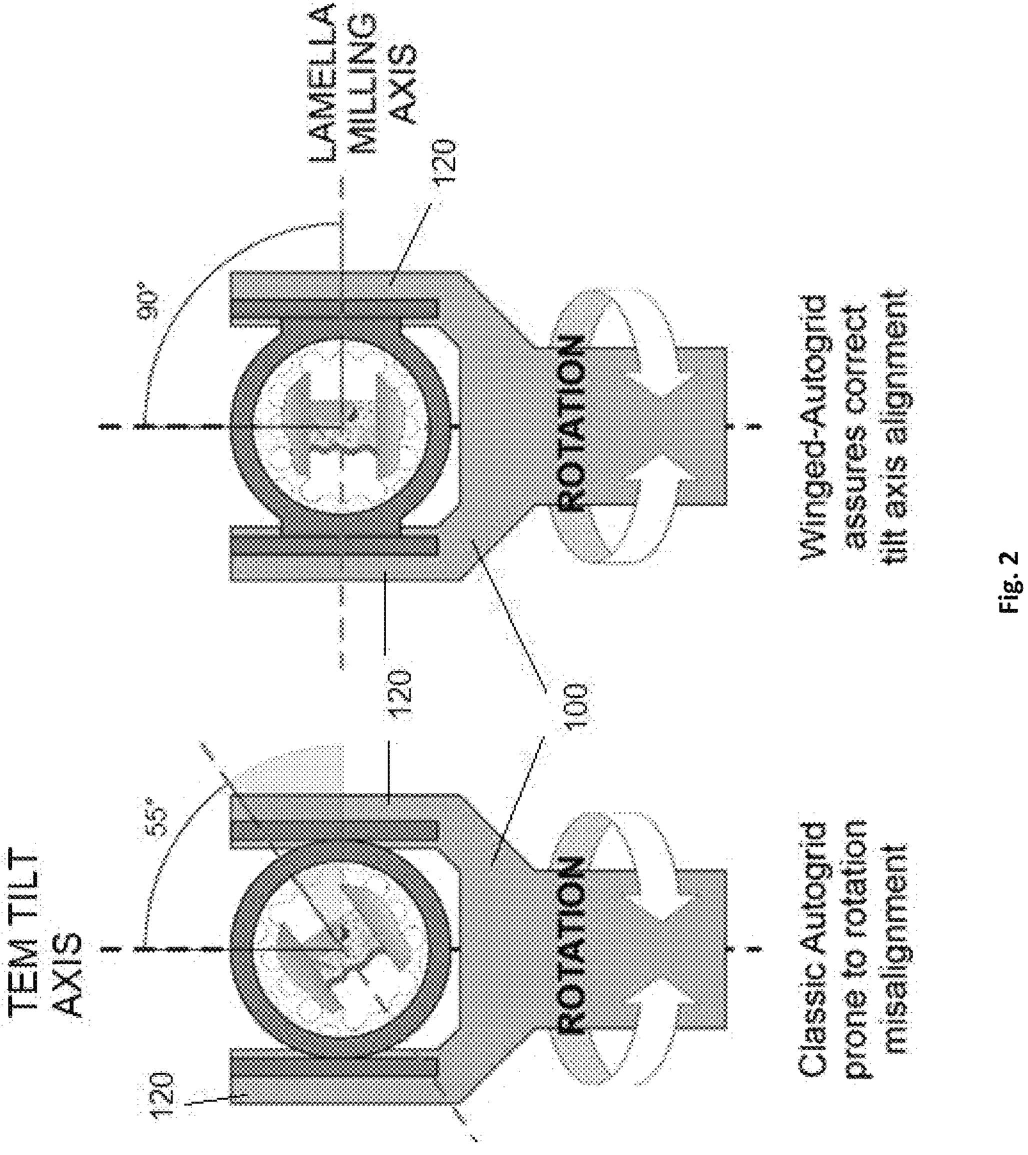
FIG. 2 shows how a sample holder of the invention provides improved alignment within a loading cassette or stage holder.

The two orientation elements fit to a respective portion of a cassette or stage holder (100) (as shown in FIG. 2), for example to complementary shaped receiving portions of the cassette or stage holder. In this way, the orientation elements fix the orientation of the sample holder with respect to the cassette or stage holder. In the embodiment shown, the orientation elements of the sample holder in the form of straight edges fit with straight receiving portions (120) on the cassette or stage holder.

FIG. 2 illustrates how the sample holder of the invention fits within a cassette or stage holder and prevents misalignment of the milled sample with the tilt axis of a charged particle microscope.

As shown, the at least one orientation element enables the sample holder to be fixed in a specific orientation within the cassette or stage holder.

The sample holder thereby enables transfer to a charged particle microscope (not shown) having cartesian axes (X,Y, Z). The transfer of the sample holder to the charged particle microscope may be performed by any means suitable for conducting the transfer and the sample holder provides means, in the form of the orientation elements, to enable the Z-axis (and therefore gamma rotation) to be correctly aligned in the charged particle microscope, in particular with the charged particle beam (such as collinear), and to enable alignment of the milled sample on the sample holder with respect to the tilt (X) axis of the charged particle microscope in step (iv). The alignment of the milled sample using the sample holder also aligns the tilt axis (X) with respect to intersecting (e.g. at 90°) the YZ plane of the milled sample.

FIG. 3 shows how the axes interact with each other and how fixing the position the sample holder allows alignment of axes provided in step (ii) with the relevant cartesian axes (X, Y, Z) in the charged particle microscope in step (iv). Not only does the cartridge or stage holder move the sample holder—and, thereby, also the sample—in the X-Y plane perpendicular to the electron beam, but it can also rotate, for example, about the longitudinal axis X of the sample holder (the so-called $\alpha$-tilt).

Figure 4:
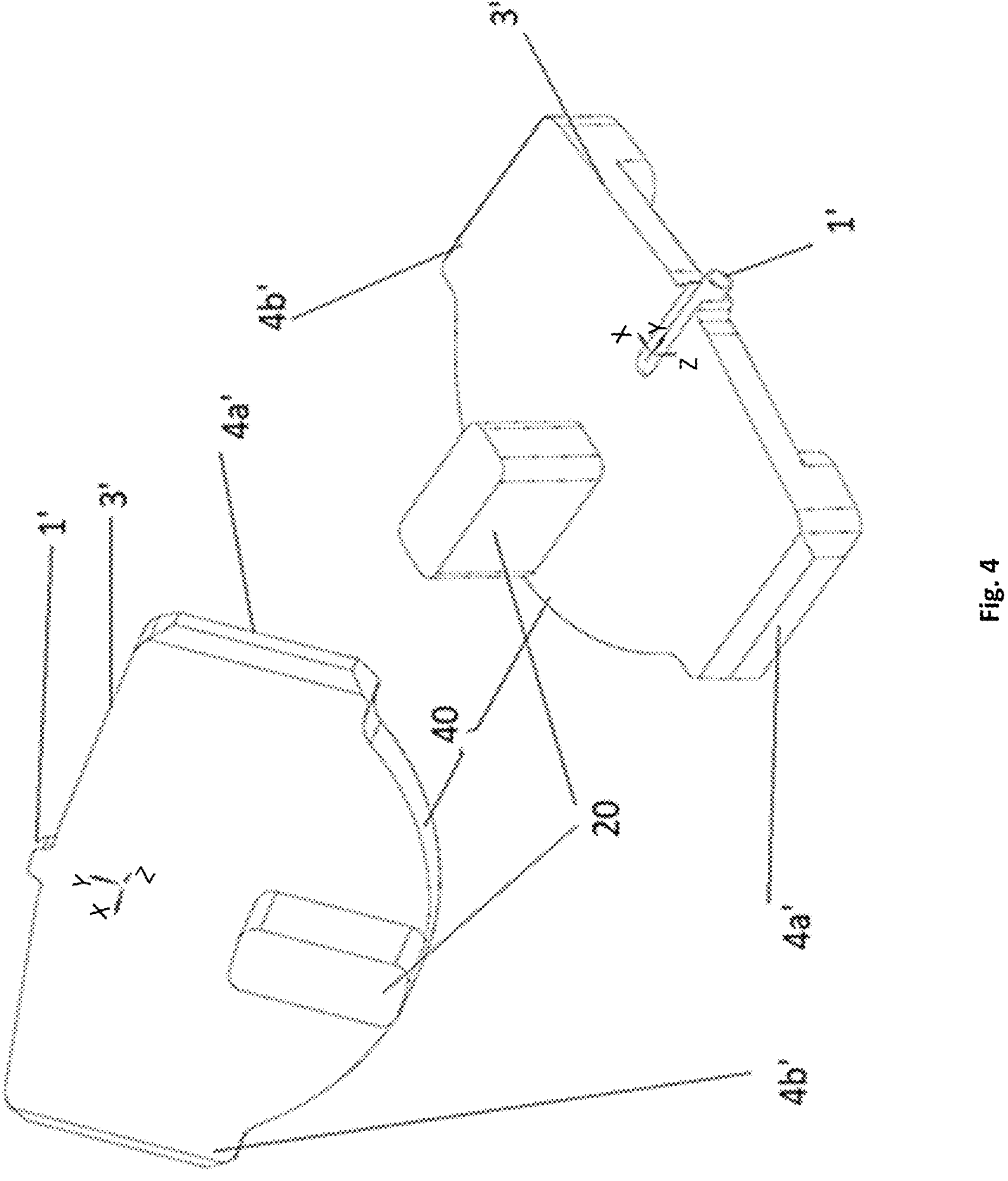
FIG. 4 shows an embodiment of a sample holder of the invention where the sample receiving area is a protrusion.

FIG. 4 shows a further embodiment of a sample holder of the invention. As shown, the sample holder comprises a sample receiving area (1').

The sample holder comprises three substantially straight edges of which two are the orientation elements (4*a*' and 4*b*').

The sample receiving area is a protrusion (10) located centrally in the third substantially straight edge.

The third substantially straight edge slopes away from the protrusion to the orientation elements, leaving the protrusion extending away from the sample holder.

A raised body (20) is located on the curved outer edge (40) opposed the protrusion, which may be used to load and unload the sample holder from a cassette or stage holder.

The two orientation elements fit to a respective portion of a cassette or stage holder (as shown in FIG. 2).

Figure 5:
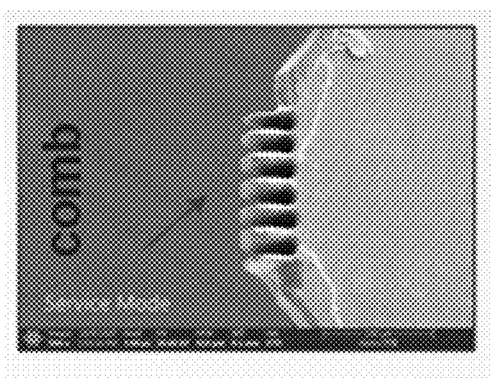
FIG. 5 shows alternative embodiments of the protrusion.
Figure 5:
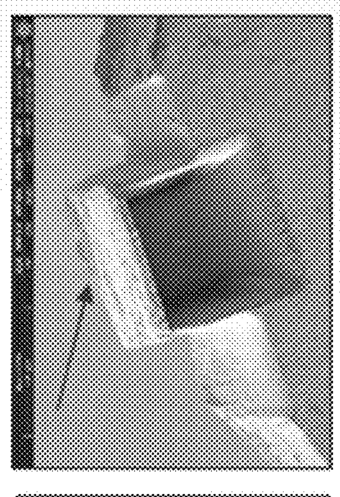
Figure 5:
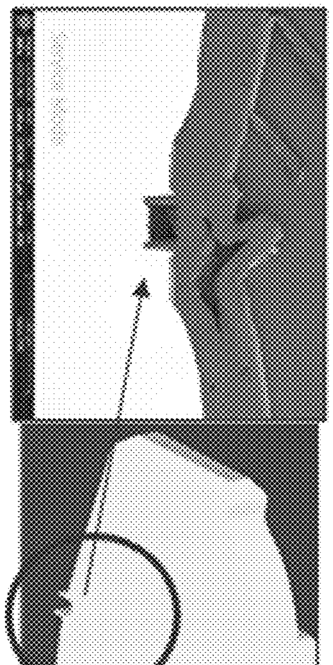

FIG. 5 illustrates preferred shapes for the protrusion in the forms of a groove, a pool, and a comb.

The invention claimed is:

1. A sample holder for carrying a sample to be irradiated with an electron beam, which sample holder comprises a sample receiving area and an outer edge, characterised in that the outer edge of the holder comprises at least one orientation element, wherein the at least one orientation element is configured to be received by a loading cassette or stage holder, wherein the outer edge further comprises a protrusion for holding a sample, characterised in that the outer edge comprising the protrusion slopes away from the protrusion.

2. A sample holder according to claim 1, wherein the sample holder comprises two orientation elements on opposing sides of the sample holder.

3. A sample holder according to claim 1, wherein the sample receiving area is located centrally in the sample holder, is at least partially transparent to electrons and the outer edge is located at the periphery of the sample receiving area.

4. A sample holder according to claim 1, wherein at least a portion of the outer edge of the holder is curved and said at least one orientation element is in the form of straight edges adjoining the curved portion of the outer edge.

5. A sample holder according to claim 1, wherein throughout at least a portion of the periphery sample receiving area, the outer edge has a thickness that is greater than the thickness of the sample receiving area.

6. A sample holder according to claim 1, wherein the outer edge is formed in such a manner that an electron beam passing through the sample receiving area, with an angle of incidence of the electron beam of +/−70 degrees with respect to the normal to the sample receiving area, will not be hindered by the outer edge.

7. A sample holder according to claim 1, whereby the outer edge has thickness that is at least twice as large as the thickness of the sample receiving area.

8. A sample holder according to claim 1, wherein the protrusion is centrally located between two orientation elements.

9. A sample holder according to claim 1, wherein the protrusion is in the form of a nanotextured or chemically modified area on the protrusion, a groove, a pool, a comb and/or a tube.

10. A sample holder according to claim 1, wherein the orientation element comprises a straight edge configured to fix the sample holder within a cassette or stage holder.

* * * * *